United States Patent
Li et al.

(10) Patent No.: US 9,912,342 B2
(45) Date of Patent: Mar. 6, 2018

(54) FLASH ANALOG-TO-DIGITAL CONVERTER CALIBRATION

(71) Applicant: Analog Devices Global, Hamilton (BM)

(72) Inventors: Zhao Li, North York (CA); Hajime Shibata, Toronto (CA); Trevor Clifford Caldwell, Toronto (CA); Yunzhi Dong, Weehawken, NJ (US); Jialin Zhao, Santa Clara, CA (US); Richard E. Schreier, New Castle (CA); Victor Kozlov, Toronto (CA); David Nelson Alldred, Toronto (CA); Prawal Man Shrestha, Somerville, MA (US)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 15/369,175

(22) Filed: Dec. 5, 2016

(65) Prior Publication Data
US 2017/0179970 A1    Jun. 22, 2017

Related U.S. Application Data

(60) Provisional application No. 62/269,810, filed on Dec. 18, 2015, provisional application No. 62/387,343, filed on Dec. 23, 2015.

(51) Int. Cl.
*H03M 1/10* (2006.01)
*H03M 1/34* (2006.01)
(Continued)

(52) U.S. Cl.
CPC ....... *H03M 1/1009* (2013.01); *H03M 1/0626* (2013.01); *H03M 1/1245* (2013.01);
(Continued)

(58) Field of Classification Search
CPC ............ H03M 1/1009; H03M 1/0626; H03M 1/1245; H03M 1/34; H03M 3/422
(Continued)

(56) References Cited

U.S. PATENT DOCUMENTS 5,063,383 A * 11/1991 Bobba ................... H03M 1/108
324/73.1
5,319,370 A    6/1994 Signore et al.
(Continued)

FOREIGN PATENT DOCUMENTS

CN    103490752    1/2014

OTHER PUBLICATIONS

Muhammed Bolatkale et al., *A 4GHz CT ΔΣ ADC with 70dB DR and -74dBFS THD in 125MHz BW*, ISSCC 2011 / Session 27 / Oversampling Converters / 27.1, 2011 IEEE International Solid-State Circuits Conference, 978-1-61284-302-5/11 © 2011 IEEE, 3 pages.
(Continued)

*Primary Examiner* — Lam T Mai
(74) *Attorney, Agent, or Firm* — Patent Capital Group

(57) ABSTRACT

An analog-to-digital converter (ADC) is a device that can include a reference shuffler and a loop filter. An ADC can achieve better performance with incremental adjustment of a pointer of the reference shuffler, changing coefficients of the loop filter, and storing calibration codes of the ADC in a non-volatile memory. By incrementally adjusting a pointer of the reference shuffler, a calibration can be performed more efficiently than with a random adjustment of the pointer. By temporarily changing the loop filter coefficients, a greater amount of activity can be introduced into the loop filter. This activity can allow the calibration to proceed more efficiently. By storing the calibration codes in a non-volatile memory, a search space for calibration codes can be reduced.
(Continued)

Thus, a calibration can occur more quickly, and the calibration itself can be improved.

20 Claims, 14 Drawing Sheets

(51) Int. Cl.
  *H03M 1/12* (2006.01)
  *H03M 1/06* (2006.01)
  *H03M 3/00* (2006.01)
(52) U.S. Cl.
  CPC ............ *H03M 1/34* (2013.01); *H03M 3/388* (2013.01); *H03M 1/066* (2013.01); *H03M 3/422* (2013.01)
(58) Field of Classification Search
  USPC .................................................. 341/118–155
  See application file for complete search history.

(56) References Cited

U.S. PATENT DOCUMENTS

| | | | |
|---|---|---|---|
| 6,380,874 B1 | 4/2002 | Knudsen | |
| 6,567,025 B2 | 5/2003 | Schreier et al. | |
| 6,839,013 B1 | 1/2005 | Cummins et al. | |
| 6,847,320 B1 * | 1/2005 | Taft | H03M 1/0646 341/120 |
| 7,221,302 B1 | 5/2007 | Melanson | |
| 7,379,831 B1 * | 5/2008 | Tsyrganovich | H03M 3/388 702/182 |
| 7,420,494 B1 * | 9/2008 | Schreier | H03M 3/42 341/143 |
| 7,576,671 B2 * | 8/2009 | Petilli | H03M 1/0663 341/143 |
| 7,728,753 B2 * | 6/2010 | Taft | H03M 1/0624 341/165 |
| 8,378,869 B2 * | 2/2013 | Chae | H03M 1/067 341/140 |
| 8,482,444 B1 | 7/2013 | Dominguez et al. | |
| 8,653,996 B2 | 2/2014 | Banarie et al. | |
| 8,884,802 B2 | 11/2014 | Li et al. | |
| 2010/0002747 A1 * | 1/2010 | Bosch | G01K 7/01 374/170 |
| 2010/0073207 A1 | 3/2010 | Gupta et al. | |
| 2014/0266825 A1 * | 9/2014 | Li | H03M 1/1009 341/120 |

OTHER PUBLICATIONS

Hajime Shibata et al., *A DC-to-1 GHz Tunable RF ΔΣ ADC Achieving DR=74 dB and BW=150 MHz at f0=450 MHz Using 550 mW*, © 2012 IEEE, 10 pages.

Yunzhi Dong et al., *A 235mW CT 0-3 MASH ADC Achieving-167dBFS/Hz NSD with 53MHz BW*, ISSCC 2014 / Session 29 / Data Converters for Wireless Systems / 29.2, © 2014 IEEE International Solid-State Circuits Conference, 3 pages.

Do-Yeon Yoon et al., *An 85dB-DR 74.6dB-SNDR 50MHz-BW CT MASH ΔΣ Modulator in 28nm CMOS*, ISSCC 2015 / Session 15 / Data-Converter Techniques / 15.1, 2015 IEEE International Solid State Circuits Conference © 2015 IEEE, 3 pages.

\* cited by examiner

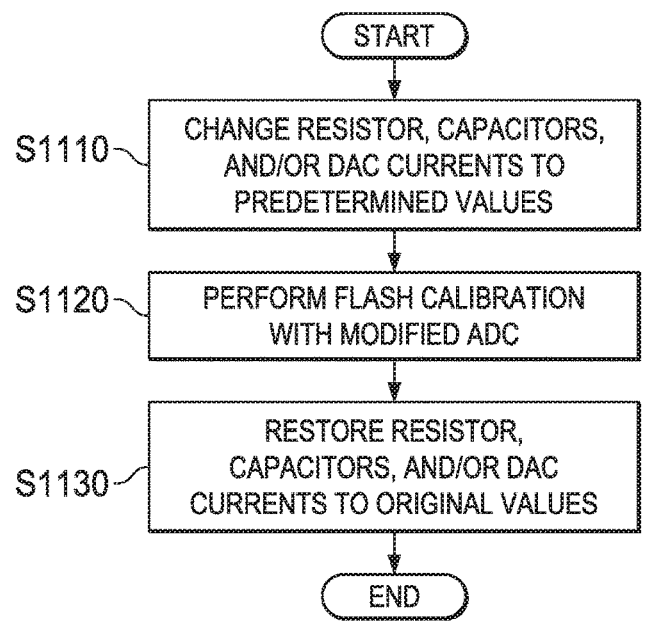
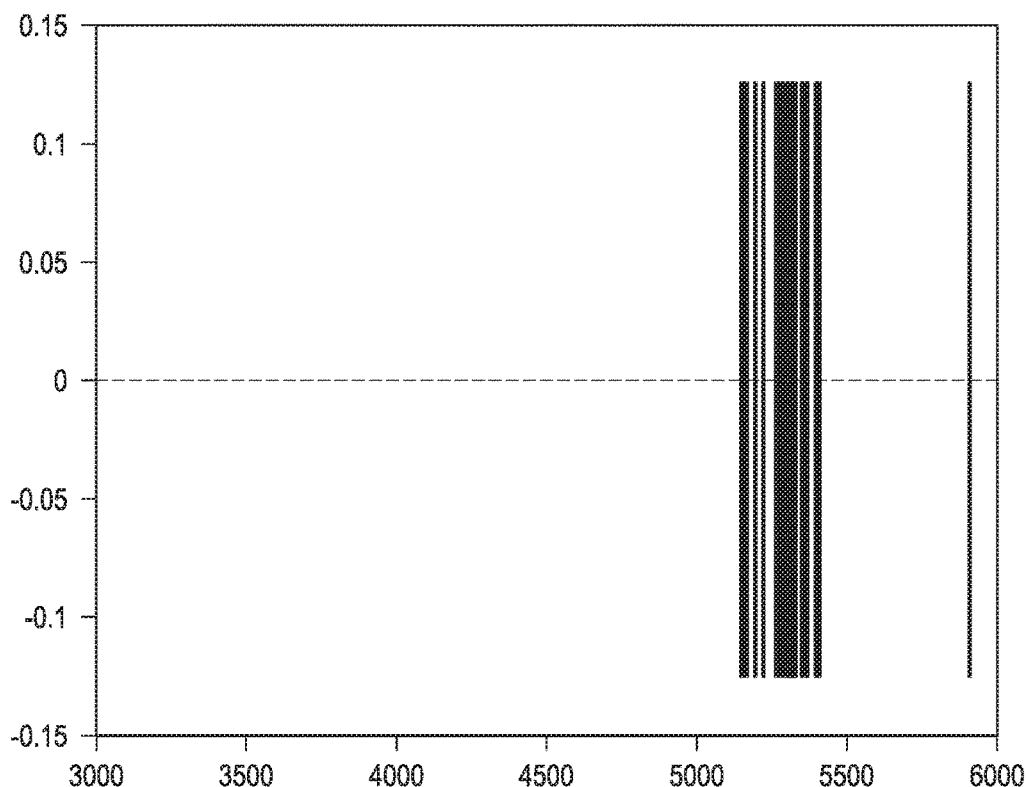

FLASH ANALOG-TO-DIGITAL CONVERTER CALIBRATION

CROSS-REFERENCE TO RELATED APPLICATIONS

This application claims the benefit of U.S. Provisional Application No. 62/269,810, filed on Dec. 18, 2015, and U.S. Provisional Application No. 62/387,343, filed on Dec. 23, 2015. The entire contents of both documents are hereby incorporated by reference in their entireties.

TECHNICAL FIELD OF THE DISCLOSURE

Analog-to-digital converters (ADCs) are devices that can include a reference shuffler and a loop filter. The present disclosure relates to an improved calibration of an ADC through adjustment of a pointer of the reference shuffler, changing coefficients of the loop filter, or storing calibration codes in a non-volatile memory.

BACKGROUND

In many electronics applications, an analog input signal is converted to a digital output signal. For instance, in precision measurement systems, an electronic device is provided with a sensor to make measurements, and this sensor can generate an analog input signal. The analog signal is then provided to an ADC to generate a digital output signal for further processing. In another instance, an antenna generates an analog signal based on electromagnetic waves carrying information/signals in the air. The analog signal generated by the antenna is then provided to an ADC to generate a digital output signal for further processing.

Thus, ADCs can be found in many places such as broadband communication systems, audio systems, receiver systems, etc. ADCs translate analog electrical signals representing real-world phenomena, e.g., light, sound, temperature or pressure, to digital signals for data processing purposes. ADCs are used in a broad range of applications including communications, energy, healthcare, instrumentation and measurement, motor and power control, industrial automation, and aerospace/defense.

Designing an ADC is a non-trivial task because each application can have different goals in speed, performance, power, cost and size. As the number of applications using ADCs grows, the desire for accurate and reliable conversion performance also grows.

SUMMARY OF THE DISCLOSURE

In some embodiments, a system for calibrating an analog-to-digital converter is provided. The system includes the analog-to-digital converter, which receives an analog input and includes a comparator that compares the analog input to a reference voltage, and a reference shuffler that shuffles a reference for the reference voltage of the comparator, the comparator to convert the analog input to digital data based on the reference. The system also includes an RMS meter that measures a power of the digital data, calibration logic that calibrates the analog-to-digital converter based on the power of the digital data, and a nonvolatile memory that stores a calibration code.

In some embodiments, a system for calibrating an analog-to-digital converter is provided. The system includes a plurality of comparators that receive an input analog signal, that compare the input analog signal to a plurality of references, and output a digital signal. The system also includes a reference shuffler that shuffles the plurality of references. The system further includes an RMS meter that receives the digital signal and outputs a measured signal. Additionally, the system includes calibration logic configured to perform an incremental shuffling for the plurality of comparators and to determine a calibration coefficient that minimizes an average flash power of one of the plurality of comparators, based on the measured signal.

In some embodiments, a method for calibrating an analog-to-digital converter is provided. The system includes determining whether the analog-to-digital converter is stable, and writing a component value to the analog-to-digital converter, if the analog-to-digital converter is determined to be stable.

BRIEF DESCRIPTION OF THE DRAWINGS

FIG. 11 shows an exemplary flash ADC calibration algorithm with modified component values;

FIG. 12 shows a power meter input with a default loop filter over 3000 samples;

DESCRIPTION OF EXAMPLE EMBODIMENTS OF THE DISCLOSURE

Basics of Analog-to-Digital Converters (ADCs)

Analog to digital converters (ADCs) are electronic devices that convert a continuous physical quantity carried by an analog signal to a digital number that represents the quantity's amplitude (or to a digital signal carrying that digital number). The conversion involves quantization of the analog input signal, so the conversion generally introduces a small amount of error. Typically, the quantization occurs through periodic sampling of the analog input signal. The result is a sequence of digital values (i.e., a digital signal)

that has converted a continuous-time and continuous-amplitude analog input signal to a discrete-time and discrete-amplitude digital signal.

An ADC is usually defined by the following application attributes: its bandwidth (the range of frequencies of analog signals it can properly convert to a digital signal), its resolution (the number of discrete levels into which the maximum analog signal can be divided and represented in the digital signal), and its signal-to-noise ratio (how accurately the ADC can measure the signal relative to the noise the ADC introduces).

Delta-Sigma Analog-to-Digital Converters (DS ADCs)

Figure 1:
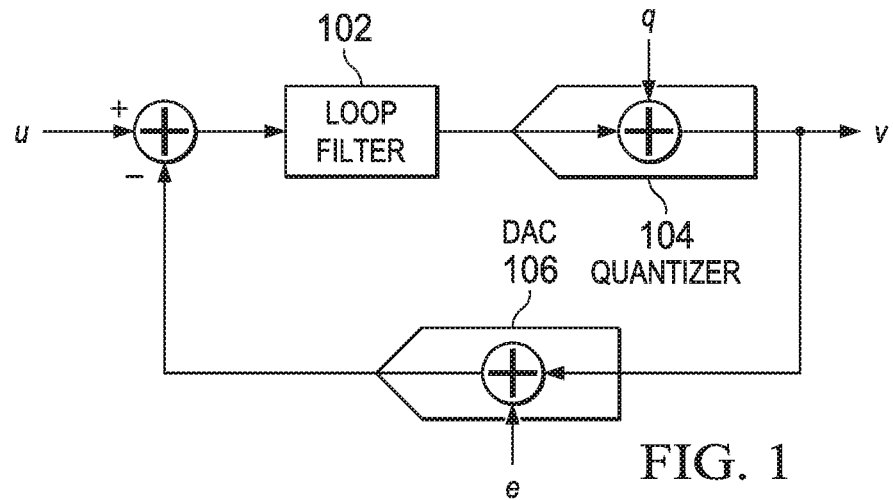
FIG. 1 is an illustrative system diagram of a delta sigma analog-to-digital converter (DS ADC)

ADCs based on delta-sigma (DS) modulation (referred to herein as "DS ADCs") have been widely used in digital audio and high precision instrumentation systems. FIG. 1 is an illustrative system diagram of a delta sigma analog-to-digital converter (DS ADC), or sometimes referred herein as a delta sigma modulator. The DS ADC includes loop filter 102, quantizer 104, and feedback digital-to-analog converter (DAC) 106 (i.e., a DAC in the feedback path of the DS ADC).

A DS ADC usually converts an analog input signal to a digital output signal with high resolution at low cost. Typically, a DS ADC encodes an analog signal u using a DS modulator.

Quantizer 104 can be used for this purpose, employing, e.g., a low resolution ADC, as a 1-bit ADC, Flash ADC, Flash quantizer, etc. Then, if applicable, the DS ADC can apply a digital filter (not shown) to the output of the DS modulator (i.e., quantizer 104) to form a higher-resolution digital output.

Loop filter 102, having one or more integrators, provides error feedback for the DS ADC and helps shape the noise from the quantizer 104 out of the baseband to higher frequencies. The error is usually generated by taking the difference between the original analog input signal u and a reconstructed version of the original analog input signal generated using the feedback DAC 106 (where a digitized signal v is converted back into an analog signal). One characteristic of a DS ADC is its ability to push the quantization noise q (from quantizer 104) to higher frequencies, also referred to as noise shaping. The amount of noise shaping depends on the order of the loop filter 102. As a result, DS ADCs are generally able to achieve high resolution analog-to-digital conversion.

The feedback DAC 106 is in a feedback configuration with quantizer 104. That is, the output of the quantizer is fed to the input of the feedback DAC 106, and the output of the feedback DAC is fed back to the input path of the quantizer. Generally speaking, the feedback DAC 106 is a multi-bit DAC which is implemented with a plurality of unit elements that are controlled by input bits to the feedback DAC 106. The resolution (bit-widths) of the feedback DAC 106 is generally the same as the resolution of the quantizer 104. Each one of the unit DAC elements, e.g., current steering cells, generates from the input digital code v fed to the feedback DAC 106 a part of an analog output signal of the feedback DAC. In some cases, these unit elements are referred to as DAC elements which make up the feedback DAC 106. The current steering circuits ideally steer the same amount of current to the output (i.e., the DAC elements are weighted the same or have the same weight).

Multi-Stage Noise Shaping Analog-to-Digital Converters (MASH ADCs)

Some DS ADC designs are concerned with power, while some other DS ADC designs are concerned with complexity. In some cases, DS ADC designs are concerned with precision, i.e., control over errors and/or noise. For example, for applications with an emphasis on noise shaping, a higher order DS modulator can be used. That is, more integrators and feedback paths are used in the loop filter for shaping even more of the quantization noise to high frequencies. Delta-sigma ADCs (e.g., FIG. 1) use quantization noise shaping combined with oversampling to trade off resolution with signal bandwidth. High-order shaping and multi-bit implementations allow for more aggressive tradeoffs, but at the risk of making the ADC unstable.

One group of structures have been proposed for DS ADCs—multi-stage noise shaping (MASH) ADCs—with some variations having a front-end and a back-end where inputs to each modulator differ and/or the implementation of the stage can differ. MASH ADCs avoid this instability concern by relying on the cascading of individually more stable delta-sigma modulators. However, the MASH ADCs rely on the cancellation of quantization noise, which can result from accurate matching between analog and digital transfer functions.

Generally speaking, MASH ADCs include a plurality of stages for digitizing the input signal and errors of the system to meet design targets related to bandwidth, resolution, and signal-to-noise ratios. One advantage of MASH ADCs is the design cascades stable low-order loops while achieving the higher performance of potentially unstable higher-order loops. One or more of these stages typically use the original analog input signal as a reference signal to produce a residual signal (i.e., an error between a reconstructed version of the analog input signal) to reduce the amount of noise introduced by the ADC and/or to increase the resolution of the output.

From the analog input signal, the first stage generates a digital output signal using a first ADC. The input of the quantizer in the first stage (e.g., the analog input signal) can be subtracted from the first DAC analog output to yield the first stage quantization noise. The result is that the first stage generates an analog signal representing its quantization noise, and the second stage quantizes the quantization noise of the first stage using a second ADC. The multi-stage approach allows the quantization noise to be reduced and thus allows the MASH ADC to achieve a higher performance. If more stages are used, the input of the quantizer in the second stage can be subtracted from the second DAC analog output to yield the second stage quantization noise which can be, in turn, quantized by a third stage. Effectively, the result is that the quantization noise of the first stage is suppressed by the second stage, and the quantization noise from the second stage is suppressed by the third stage. Thus, the MASH ADC yields the same suppression of noise as a single third-order loop, even though three, more stable first-order loops are used instead.

Figure 2:
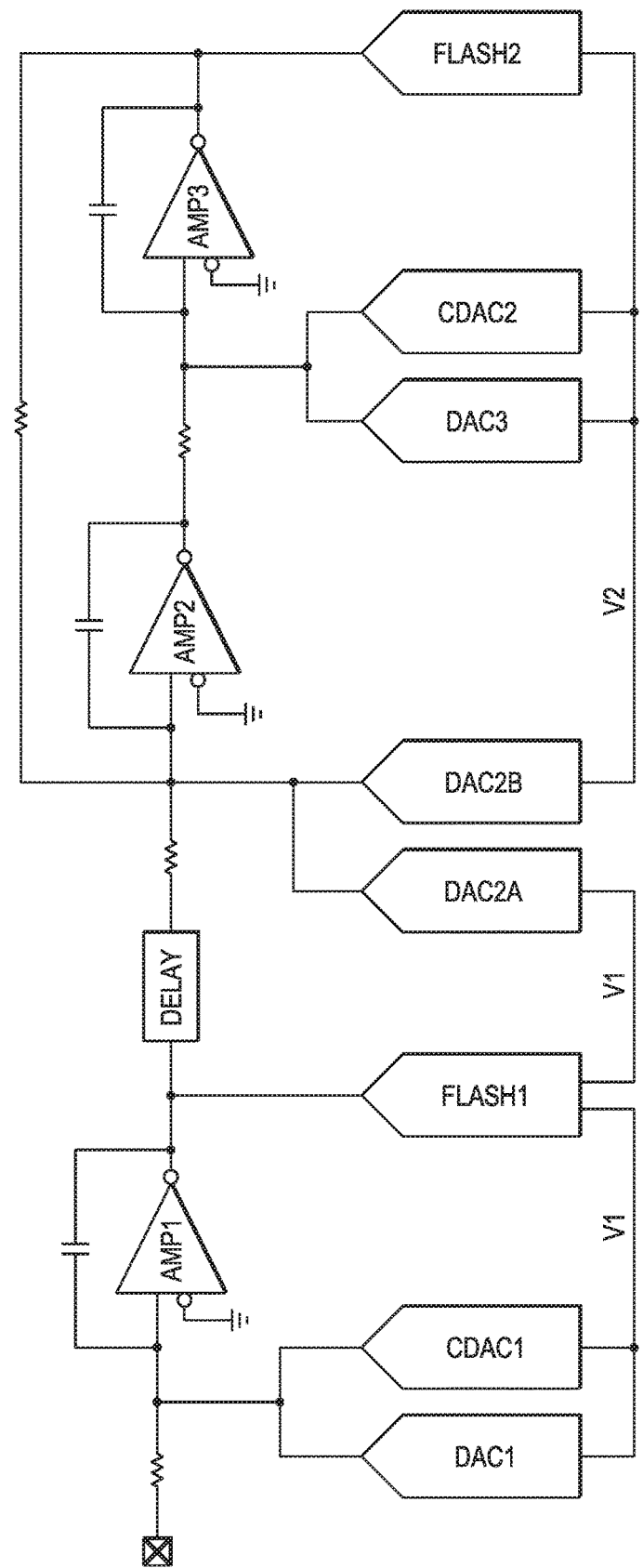
FIG. 2 is an illustrative system diagram of a 1-2 continuous time multi-stage delta sigma analog-to-digital converter (CT MASH ADC), according to some embodiments of the disclosure.

FIG. 2 is an illustrative system diagram of a 1-2 continuous time (CT) MASH ADC, according to some embodiments of the present disclosure. In this example, the CT MASH ADC has two stages: a first order delta sigma modulator as the first stage (or front end), and a second order delta sigma modulator as the second stage (or back end). The order of the delta sigma modulator is determined by the number of integrators (number of feedback loops) in the stage. While this example is a 1-2 CT MASH ADC, the present disclosure is applicable to a variety of converters, including other CT MASH ADC architectures, other MASH ADC architectures, and pipeline modulators having a feedback DAC whose errors affect the overall performance of the converter.

Referring back to FIG. 2, the residue of the coarse quantization provided by the flash quantizer (FLASH1) inside the first order front end is fed to the second order back end and digitized. The digital outputs V1 and V2 are properly combined in the digital domain as the final digital word of the 1-2 CT MASH ADC. The nonlinearity of the feedback DACs, i.e., the static mismatch, the timing mismatch error (sometimes referred to as timing error) and the switching error (sometimes called switching mismatch error or duty cycle error), will introduce harmonic distortion in the modulator.

Storing Calibration Codes in NVM

Figure 3:
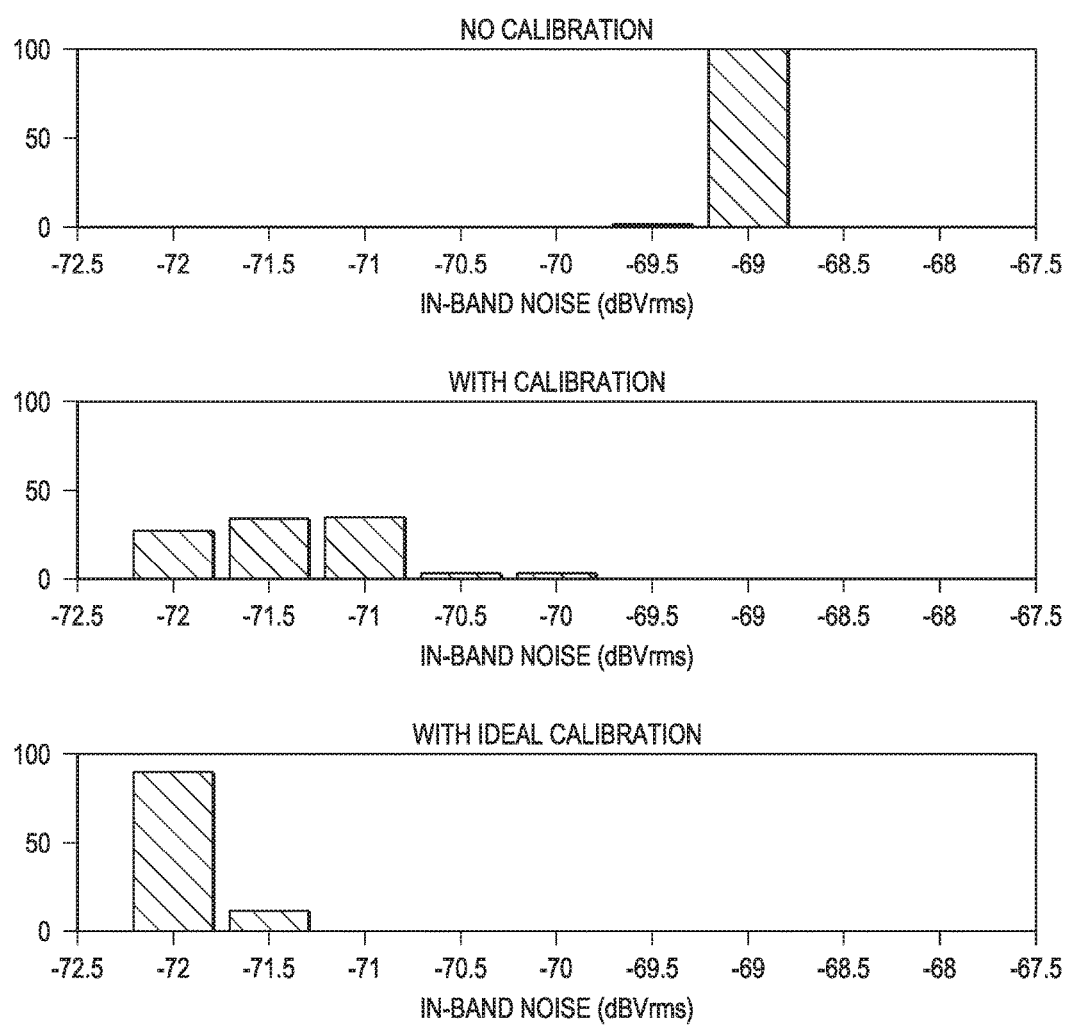
FIG. 3 is a histogram of calibrations on a single part.

An existing flash calibration algorithm suffers from consistency issues. These issues are illustrated in FIG. 3. In particular, FIG. 3 illustrates a plurality of histograms. The top histogram illustrates in-band noise of a device without calibration of the device. The middle histogram illustrates in-band noise after calibration of the device. The bottom histogram illustrates in-band noise with perfect calibration of the device.

In particular, the middle histogram of FIG. 3 shows that, over 100 calibrations on the same part, there are a few calibrations that result in a 2 dB degradation.

In practice, parts are initially screened for performance on a tester, with poorly performing parts being thrown out. There is then a possibility that a degraded level of performance is obtained, when the calibration is re-run by the customer in the field. In this case, the customer may return the parts and cause monetary and reputational damage to the company. Thus, this degradation can be particularly problematic.

Figure 4:
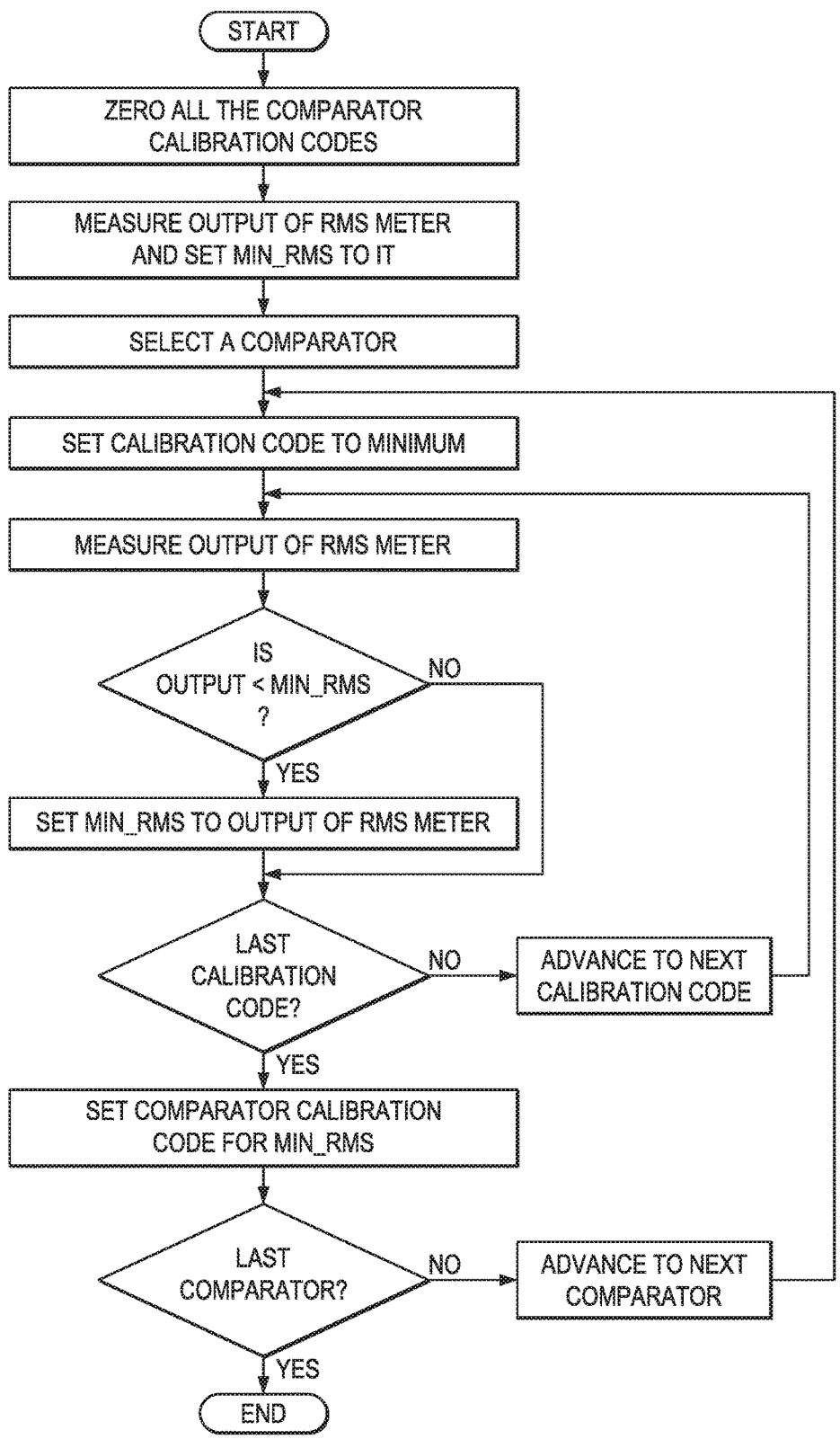
FIG. 4 is a flowchart illustrating a conventional flash ADC calibration algorithm without a non-volatile memory.

FIG. 4 is a flowchart illustrating a conventional flash ADC calibration algorithm without using non-volatile memory. Since there is no information from previous calibrations, the calibration codes for all the comparators are initially zeroed, and an output of an RMS power meter is measured. The calibration logic then selects a comparator and begins a calibration code for the comparator at the minimum calibration code for the comparator. The tester or calibration logic then searches through all the possible calibration codes for the comparator to determine which calibration code produces a minimum RMS power output. After setting the calibration code of the comparator to that calibration code, the calibration logic advances to the next comparator and again searches through all the possible calibration codes for the next comparator.

By modifying the system to include a non-volatile memory, the search space can be constrained, thereby resulting in a faster calibration. In particular, the non-volatile memory can store the calibration codes found on the tester. When the system is powered on in the field, the ADC will retrieve from the nonvolatile memory the codes that were found on the tester. Hence, performance consistency can be maintained.

The nonvolatile memory can be an erasable programmable read-only memory (EPROM), an electrically erasable programmable read-only memory (EEPROM), a flash memory, a ferroelectric RAM (including, but not limited to, polymer printed ferroelectric memory), or a magnetoresistive RAM.

Figure 5:
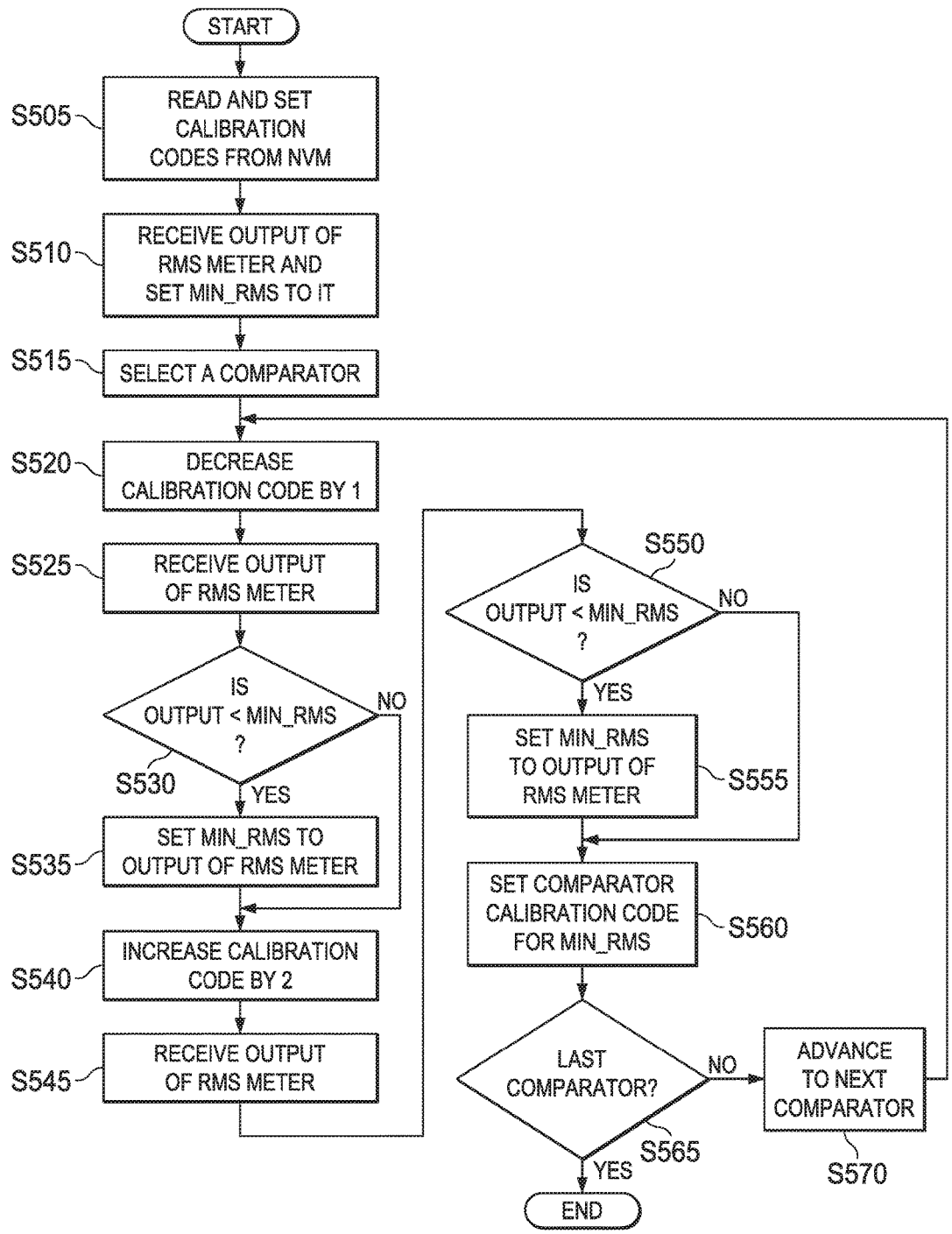
FIG. 5 is a flowchart illustrating an exemplary algorithm of a flash ADC being calibrated with a non-volatile memory.

FIG. 5 illustrates an example flow chart of an algorithm for calibrating a flash ADC with a non-volatile memory.

The algorithm starts at S505, at which the chip is powered on and the tester or calibration logic reads the initial calibration codes for a plurality of comparators from the non-volatile memory. Each of the comparators converts an analog input signal to a digital output signal based on the calibration codes. These calibration codes are stored in a memory.

At S510, an RMS power meter in the system measures and outputs an RMS power of the digital output signal of the ADC. The tester or calibration logic receives a value of this power and sets a Min_RMS value equal to the value of this power.

At S515, the tester or calibration logic selects an initial comparator of the plurality of the comparators.

At S520, the tester or calibration logic decreases the initial calibration code of the selected comparator by one. The comparator converts an analog input signal to a digital output signal, based on the decreased calibration code.

At S525, the RMS power meter measures and outputs an RMS power of the digital output signal of the ADC. The tester or calibration logic receives a value of this power.

At S530, the tester or calibration logic determines whether the output of the RMS meter received at S525 is less than the Min_RMS value.

If the tester or calibration logic determines at S530 that the RMS meter output is less than the Min_RMS value, then the tester or calibration logic sets the Min_RMS value equal to the RMS meter output at S535. The tester or calibration logic also stores the current calibration code in a memory. The algorithm then proceeds to S540.

If the tester or calibration logic determines at S530 that the RMS meter output is not less than the Min_RMS value, the algorithm proceeds to S540.

At S540, the tester or calibration logic increases the calibration code of the selected comparator by two. The comparator converts an analog input signal to a digital output signal, based on the increased calibration code.

At S545, the RMS power meter measures and outputs the RMS power of the digital output signal of the ADC. The tester or calibration logic receives a value of this power.

At S550, the tester or calibration logic determines whether the RMS meter output received at S545 is less than the Min_RMS value.

If the tester or calibration logic determines at S550 that the RMS meter output is less than the Min_RMS value, then the tester or calibration logic sets the Min_RMS value equal to the RMS meter output at S555. The tester or calibration logic also stores the current calibration code in a memory. The algorithm then proceeds to S560.

If the tester or calibration logic determines at S550 that the RMS meter output is not less than the Min_RMS value, then the algorithm proceeds to S560.

At S560, the tester or calibration logic reads the calibration code that generated the Min_RMS value from a memory. The tester or calibration logic then sets the calibration code of the selected comparator to that calibration code that generated the Min_RMS value. The tester or calibration logic also stores the calibration code in the nonvolatile memory.

At S565, the tester or calibration logic determines whether the selected comparator is the last comparator.

If the tester or calibration logic determines at S565 that the selected comparator is not the last comparator, then the tester or calibration logic selects the next comparator at S570. The algorithm then returns to S520.

If the tester or calibration logic determines at S565 that the selected comparator is the last comparator, then the algorithm ends.

Thus, with the previous calibration codes stored in the nonvolatile memory, the tester or calibration logic does not need to run a calibration algorithm that searches all the possible calibration codes for each comparator. Rather, the tester or calibration logic can run an algorithm that only searches for calibration codes adjacent (e.g., ±1) to the calibration code stored in the non-volatile memory.

Calibrations might be re-run, such as by the customer in the field or as aging effects cause performance degradations over time. A search algorithm can use stored calibration codes as the starting point for new calibrations. Since the algorithm looks for codes that result in better performance, the new calibration codes will result in the same or better performance than what was obtained on the tester.

Reference Shuffler Pointer

Flash calibration in a 1-2 continuous time multi-stage delta sigma analog-to-digital converter is based on a "random walk" method. In this random walk method, the DC calibration currents are randomly changed for each comparator, and the combination that gives the best performance with no input signal is picked. During the calibration, the references to the comparators are shuffled either incrementally via SPI or by using the built-in fast shuffle to ensure all the comparators are toggled when the effect of the calibration current is measured and any dynamic errors due to shuffling are removed.

The present algorithm is suitable for a two-stage sigma delta ADC that has two flash stages that are calibrated.

Figure 6:
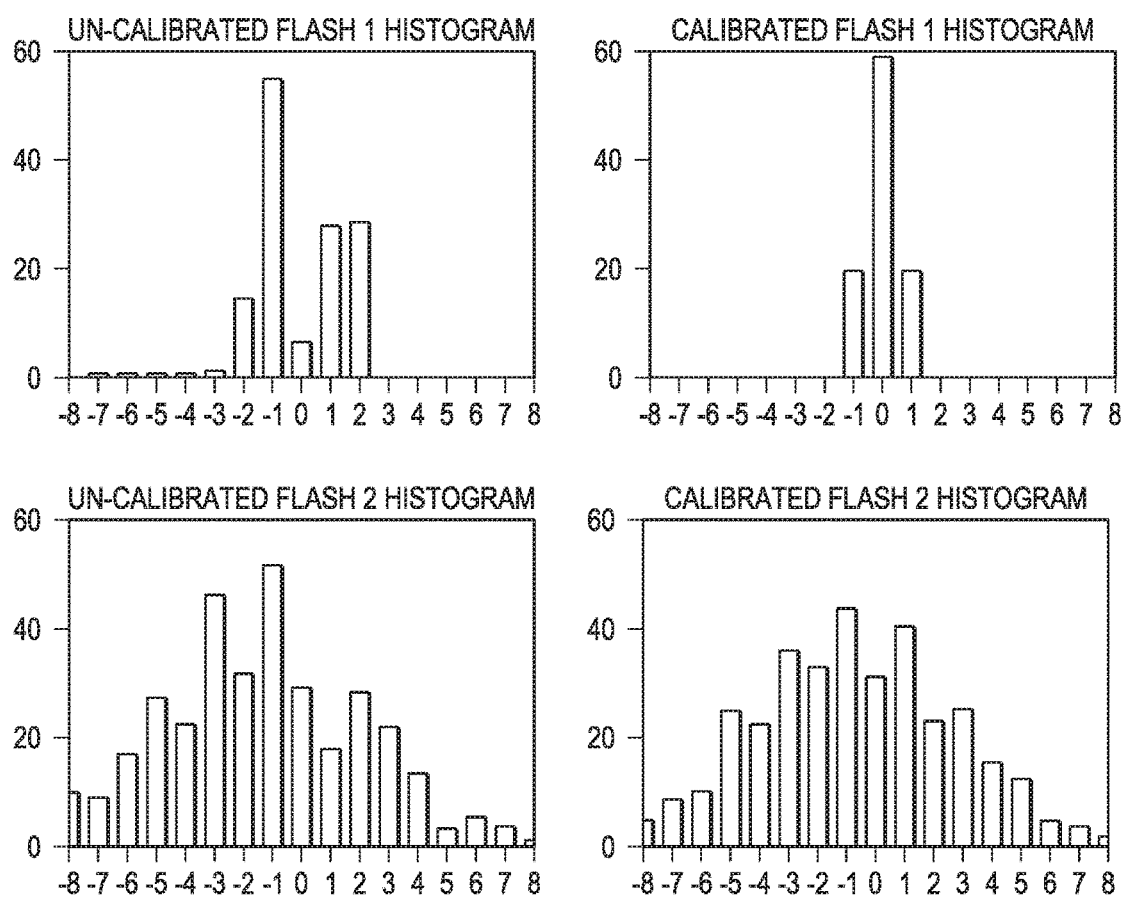
FIG. 6 shows histograms of calibrated and uncalibrated flash stages in a two-stage sigma-delta ADC.

For the first stage of the two stages, the metric of a good calibration is having the output power from the first flash ADC be as close to zero as possible. A well-calibrated first flash ADC will have a very narrow Gaussian distribution (almost impulse-like) with most of the output code being 0 and little +/−1 toggling, as illustrated in the top row of FIG. 6.

Similar to the first stage, the metric of a good calibration for the second stage of the two stages is having the power out from the second flash ADC be as low as possible. A well-calibrated second flash will have a wider Gaussian distribution, as shown in the bottom row of FIG. 6, as the second flash ADC quantizes the residue from the first stage.

Each of the first and second flash ADCs has 16 comparators that can be calibrated. Each flash ADC can be calibrated independently. When the first flash ADC is being calibrated, the second stage is turned off. When the second flash ADC is being calibrated, the first and second amplifiers are turned off.

Figure 7:
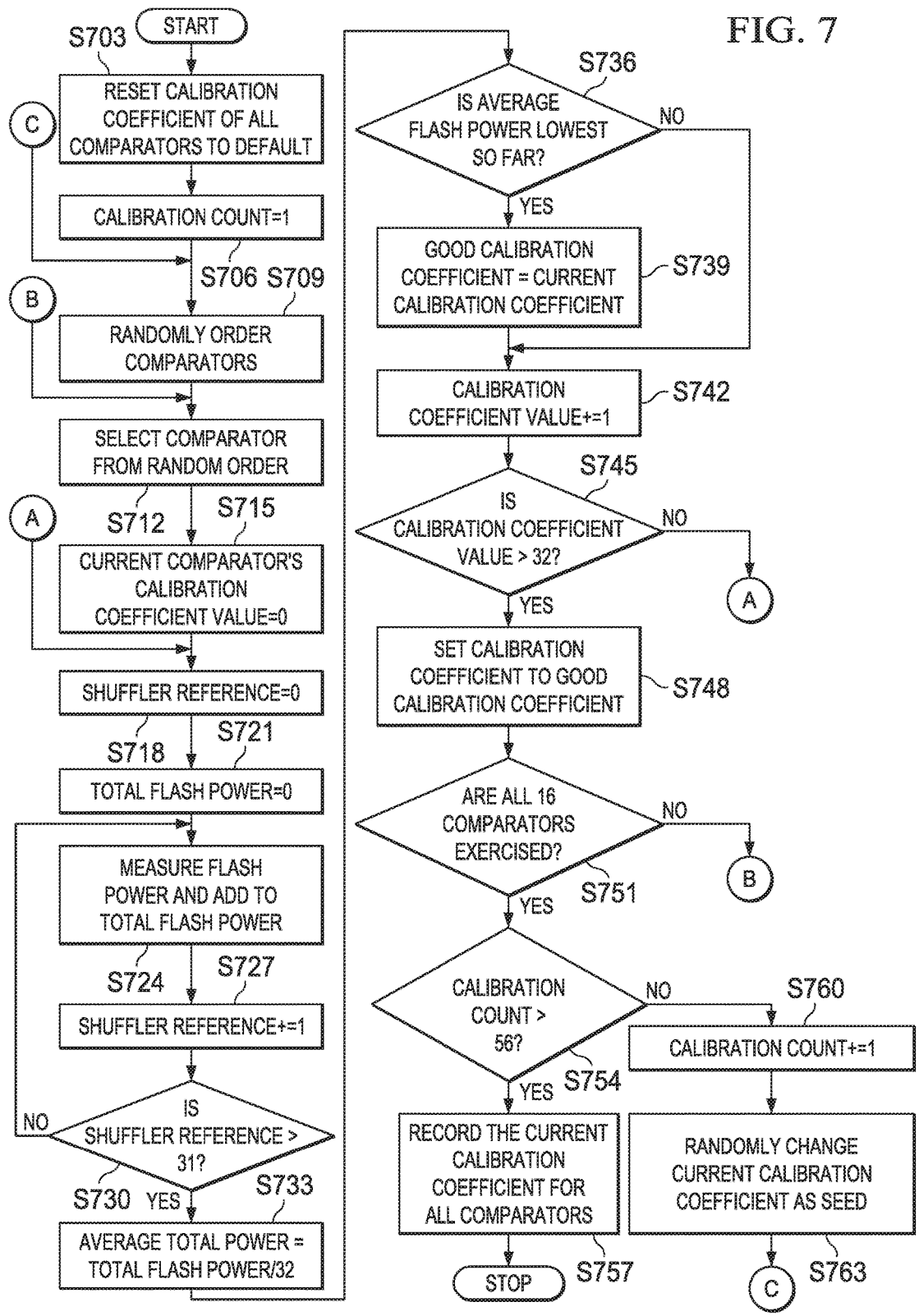
FIG. 7 shows an exemplary flash ADC calibration algorithm with incremental shuffler reference control.

FIG. 7 illustrates an algorithm for a flash ADC calibration procedure with incremental shuffler reference control. In this control, a SPI interface incrementally adjusts the references of the shuffler.

Conventionally, the shuffler references are calibrated in a random-walk scheme. In such a random-walk scheme, it can take a long time for a comparator to be connected to all of the reference voltages. The present incremental adjustment can decrease a calibration time over such a random-walk shuffler calibration scheme.

Thus, in practice, a default (e.g., random-walk) shuffling scheme first can be disabled.

Then, a calibration coefficient of each comparator is set to a default value (e.g., 0) at S703. Further, a variable indicating the calibration count is initialized to 1 at S706.

A sequence in which the 16 comparators of the ADC are corrected is generated at S709. This generation can be random or pseudo-random.

A first comparator from the generated order is selected at S712. At S715, the calibration coefficient value of the comparator is zeroed. In one embodiment, this calibration coefficient value changes the calibration current of the comparator. At S718, a reference shuffler pointer is zeroed. At S721, the total flash power is zeroed.

Next, the references seen by the comparators are shuffled. In one embodiment, the reference is shuffled via an incremental shuffling written by a SPI interface. In another embodiment, the reference is shuffled using a fast shuffling. In some embodiments, such a shuffling presents all of the comparators a chance to toggle, and the calibration accounts for any dynamic error.

In the incremental shuffling, the threshold seen by the comparators is programmable via the SPI interface. In one embodiment, there are 32 possible comparator threshold settings. The algorithm goes through each of these threshold settings sequentially, and the RMS power meter measures the power output by the ADC. That is, although only one comparator is changed at a time, the RMS power meter considers an output of all of the comparators. In one embodiment, each measurement looks at 32768 ($=2^{15}$) samples of flash output. Thus, in one embodiment, in total, 1048576 samples ($=32$ thresholds×32K samples) are observed for power measurement. In some embodiments, these numbers are programmable and can be optimized for speeding up calibration or improving performance. The powers for all 32 settings are added to compute a total power.

Thus, at S724, the RMS meter measures the power output by the flash ADC, and the power is added to the total flash power.

The SPI write increments the shuffler reference at S727.

At S730, the calibration logic determines whether the shuffler reference is greater than a maximum value (e.g., 31). As discussed previously, in one embodiment, there are 32 possible correction values (e.g., shuffler references) for a given comparator: −16 to +15, in steps of 1. Thus, the flash power is measured for each correction setting of the comparator.

If the calibration logic determines at S730 that the shuffler reference is not greater than the maximum value (e.g., 31) at S730, then the calibration logic returns to S724. Thus, the calibration logic can add the powers for all 32 sequences to come up with a total power.

If the calibration logic determines at S730 that the shuffler reference is greater than the maximum value (e.g., 31), then the calibration logic proceeds to S733.

At S733, the calibration logic determines the average flash power. In particular, the calibration logic divides the total flash power by the number of shuffler reference values (e.g., 32) to determine the average flash ADC power.

At S736, the calibration logic determines whether the average flash power is the lowest average flash power for the current calibration coefficient.

If the calibration logic determines at S736 that the average flash power is the lowest average flash power for the current calibration coefficient of the comparator, then the calibration logic stores the current calibration coefficient in a memory at S739. That is, the calibration logic selects the correction that gives an improved metric for that comparator. In one embodiment, the calibration logic selects the correction setting that results in the lowest average flash ADC output power. Thus, the calibration current of that comparator is changed. The calibration logic then proceeds to S742.

At S742, the calibration logic increments the current calibration coefficient. The algorithm then advances to S745.

If the calibration logic determines at S736 that the average flash ADC power is not the lowest total flash power for this calibration coefficient, then the calibration logic then proceeds to S742.

At S745, the calibration logic determines whether the calibration coefficient value is greater than a maximum value (e.g., 32). If the calibration logic determines at S745 that the calibration coefficient value is not greater than the maximum value, then the calibration logic returns to S718.

If the calibration logic determines at S745 that the calibration coefficient value is greater than the maximum value, then the calibration logic sets at S748 the calibration coefficient to the calibration coefficient stored, e.g., in S739. Once the calibration logic selects the correction for the first comparator, the first comparator is set to that correction value at S748.

At S751, the calibration logic determines whether all (e.g., 16) of the comparators have been exercised.

If the calibration logic determines at S751 that not all of the comparators have been exercised, then the calibration logic returns to S712. Thus, the calibration logic calibrates another comparator by returning to S712 for selecting the next comparator.

If the calibration logic determines at S751 that all of the comparators have been exercised, the calibration logic determines at S754 whether the calibration count has exceeded a predetermined value. This predetermined value can be an empirically determined value (e.g., 56). The predetermined value can be changed to speed up calibration or improve performance.

If the calibration logic determines at S754 that the calibration count has not exceeded the predetermined value, then the calibration logic increments the calibration count at S760. Then, at S763, the calibration logic takes the improved calibration coefficients for all of the comparators and randomly changes the calibration coefficients as the seeds for the next sequence of calibration.

The calibration logic then returns to S709. Thus, once all 16 comparators have been calibrated, the sequence of the 16 comparators is randomized again, and the flash ADC is recalibrated.

If the calibration logic determines at S754 that the calibration count has exceeded the predetermined value, then the calibration logic records the current calibration coefficient for all comparators at S757. Thus, after 56 attempts, the selected flash calibration coefficient is the correction value that produces the lowest measured flash output power. Following S757, the default (e.g., random-walk) shuffling scheme can be re-enabled for live operation, and the algorithm concludes.

In contrast to this incremental shuffling, in the fast shuffling, the ADC has a built-in fast shuffling architecture that randomly moves around the references seen by each of the comparators. A programmable number of samples of flash output (e.g., 32768) are measured once to measure the power associated with a particular calibration coefficient value.

Changing Loop Filter Coefficients

Changed loop filter coefficients can improve a calibration of an ADC.

More specifically, an ADC can be designed with a fairly benign loop filter in the sense that the loop filter is not designed to aggressively shape quantization noise. A loop filter is considered more aggressive if it has more high-frequency gain.

With a benign loop filter, the output of the ADC will stay mostly at zero with a small or no input signal, as shown in FIG. 12. FIG. 12 shows a power meter input with a default loop filter over 3000 samples.

The ADC output staying at zero can be problematic since the output of the RMS meter will mostly return the same zero value irrespective of the calibration codes used. Hence, the benign loop filter can lead to erroneous calibrations.

To solve this problem, the amount of activity can be increased within the loop filter. One way to increase the amount of activity is to modify the loop filter to be more aggressive.

Figure 13:
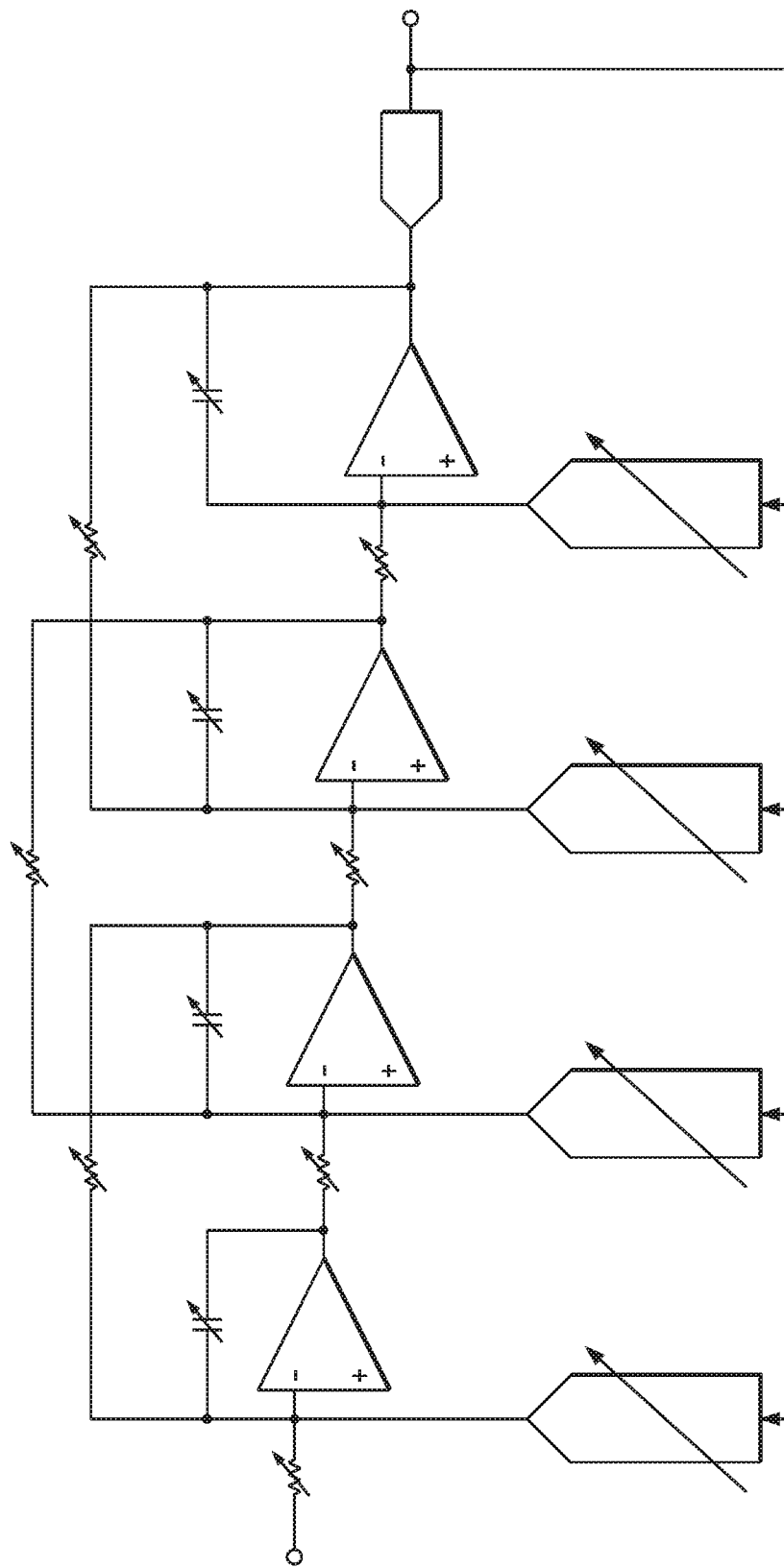
FIG. 13 shows an example A ADC loop filter in which the transfer function can be modified by changing resistor values, capacitor values, or DAC currents.

FIG. 13 shows an example A ADC loop filter in which the transfer function can be modified by changing resistor values, capacitor values, or DAC currents. By adjusting the values of the resistors, the capacitors, and/or the DAC currents in this example loop filter, an increase in the amount of activity in the loop filter can be achieved.

The aggressiveness of the loop filter can be verified by looking at the transfer function from the input ($V_{IN}$) of the 17-level ADC to the output $D_{OUT}$. This transfer function is called the noise-transfer function (NTF). A comparison of the NTF of the original loop filter and of the modified loop filter is plotted in FIG. 14.

Figure 14:
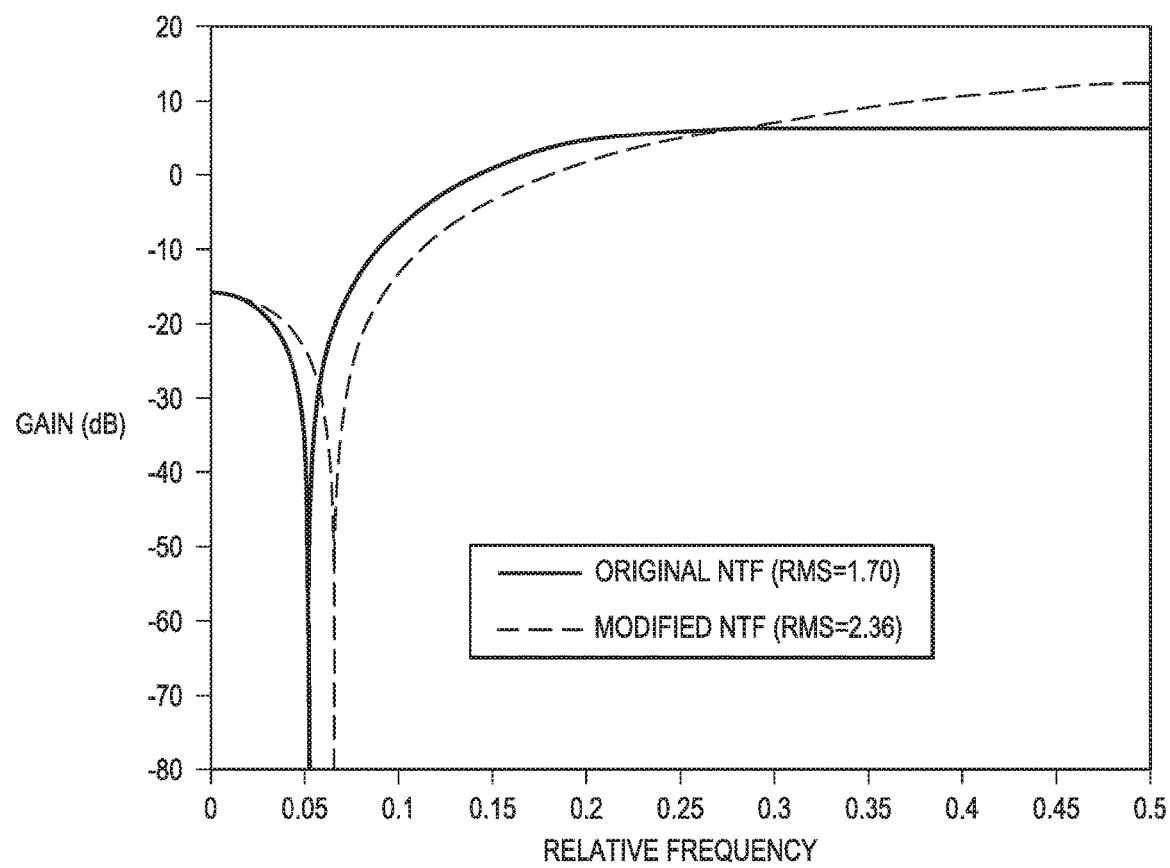
FIG. 14 shows a comparison of an original and a modified loop filter noise transfer function (NTF)

As shown in FIG. 14, the original NTF drops to −80 db gain first and does not reach a 10 db gain. In contrast, the modified NTF drops to −80 db gain relatively later and eventually surpasses a 10 db gain. As is clearly evident, the modified NTF has more gain in the high frequency region, and it also has a higher total gain (RMS) than the original NTF.

Figure 15:
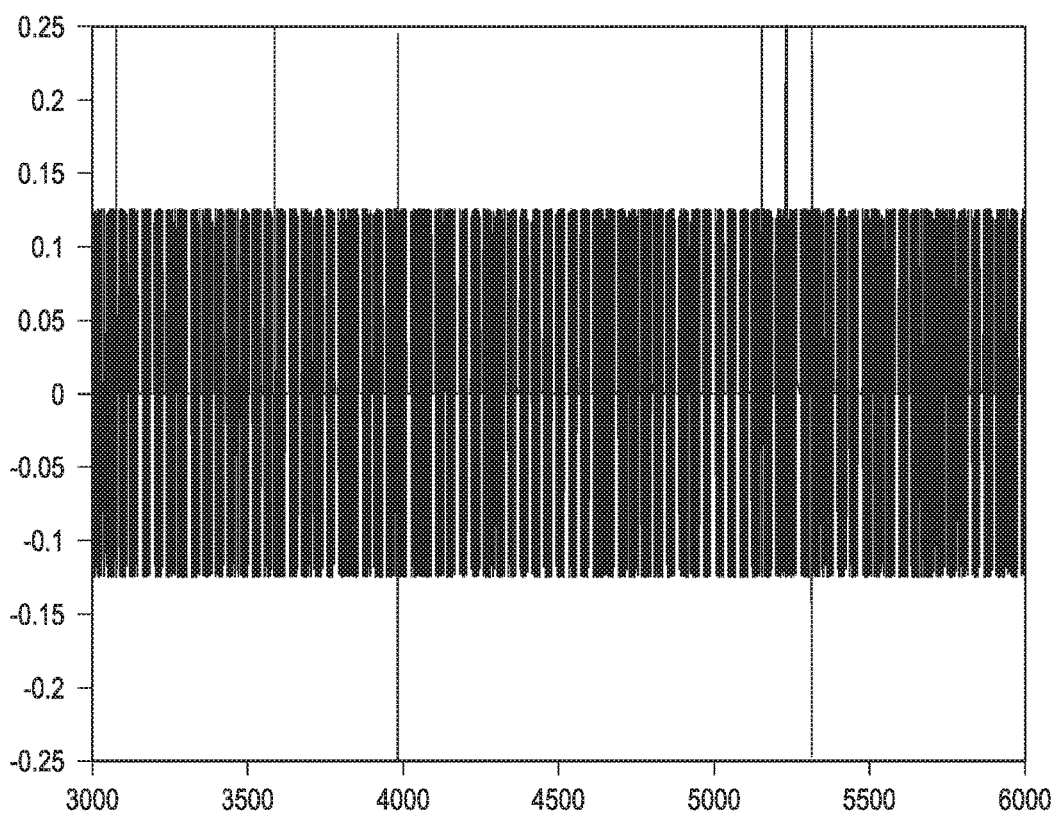
FIG. 15 shows a power meter input with a modified loop filter over 3000 samples.

With more gain in the high frequency region and more overall gain, it might be expected that the ADC's output also has more activity with a small or no input signal, especially high frequency activity. This additional activity is confirmed by observing the ADC's output with the modified loop filter, which is shown in FIG. 15. In particular, FIG. 15 shows a power meter input with a modified loop filter over 3000 samples.

Figure 8:
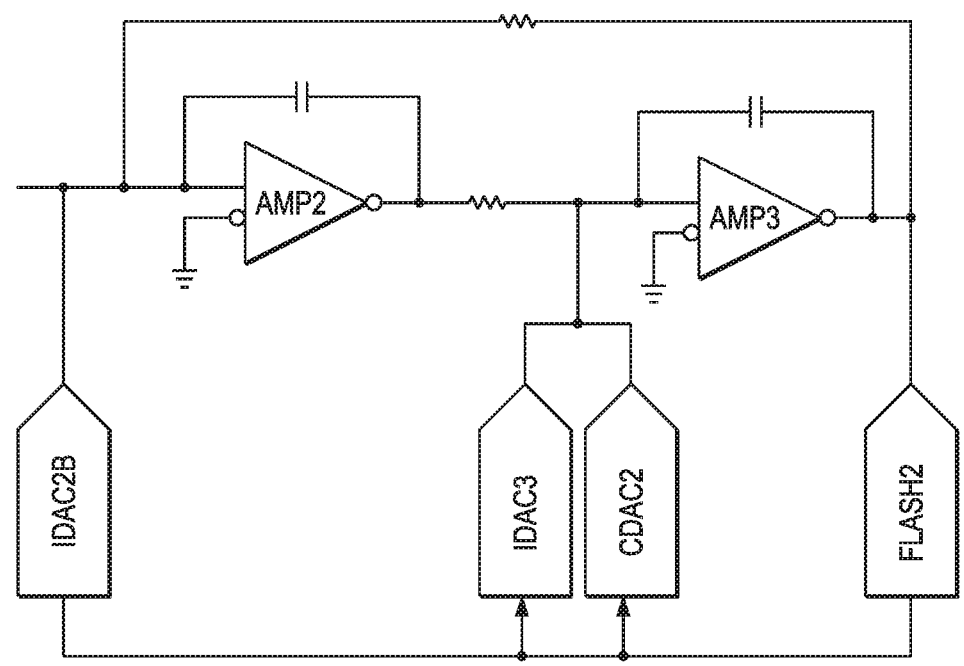
FIG. 8 shows a block diagram of a backend modulator in a 1-2 CT MASH ADC.

Turning to an implementation of changing the loop filter coefficients, FIG. 8 illustrates a block diagram of a backend modulator in a 1-2 CT MASH ADC. The default coefficients of the illustrated resistors, capacitors, and DAC current sources (i.e., R23, C2, R32, C3, and IDAC2B) cause the modulator to exhibit dead zones when no input is applied. These dead zones lead to difficulties in calibration of the flash ADC (i.e., FLASH2).

The component values are all programmable with a SPI interface and can be modified to increase the noise-transfer function in a way such that the dead zones are eliminated. This modification is done by making the modulator more unstable via a higher $\|H\|_\infty$. The concern is that if $\|H\|_\infty$ is set too high, the modulator might become unstable even with a small or no input signal. $\|H\|_\infty$ is the infinity norm of the ADC noise transfer function H.

Figure 9:
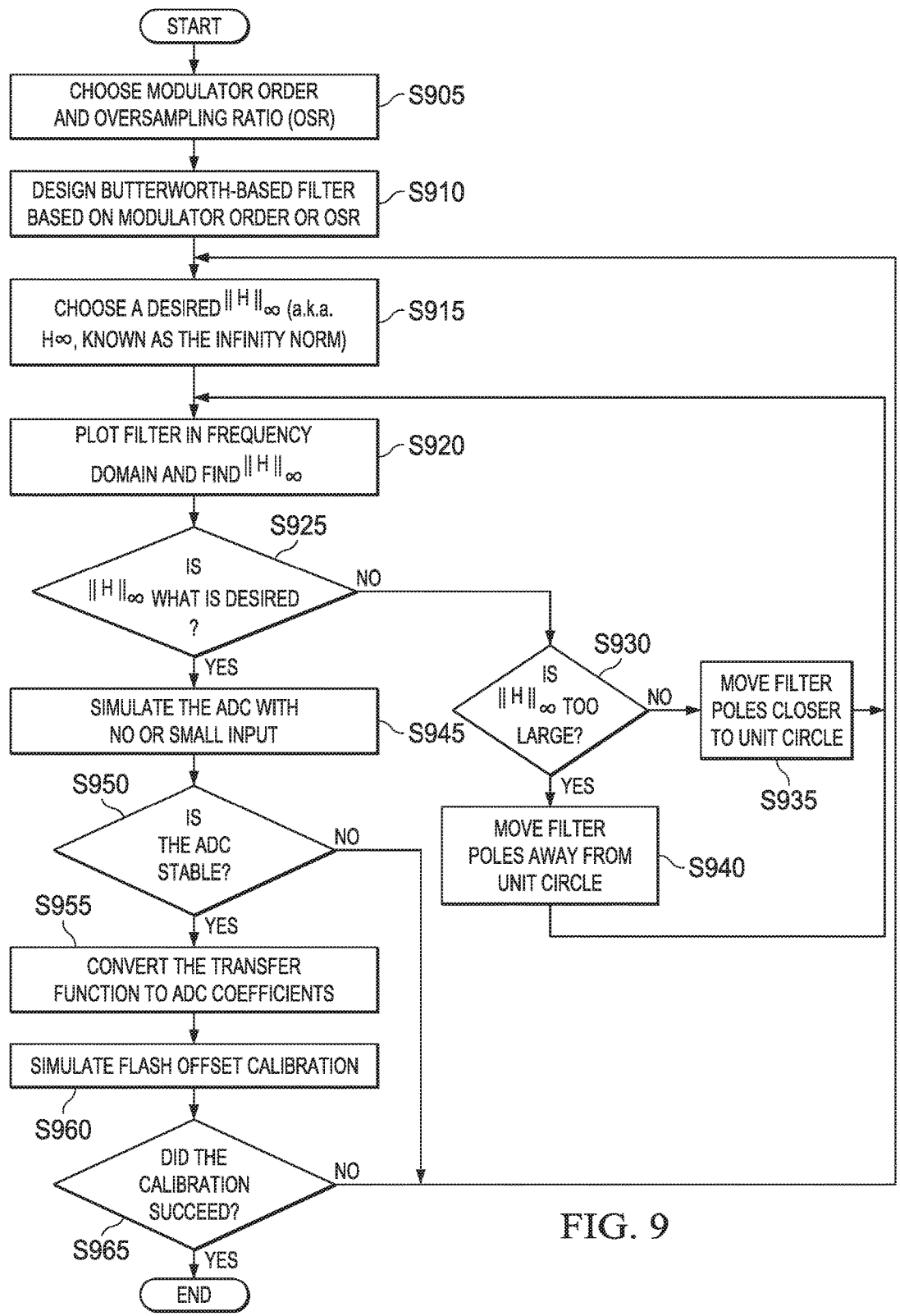
FIG. 9 shows an exemplary algorithm to determine modulator coefficients for a flash calibration.

FIG. 9 illustrates an algorithm to determine the component values (i.e., modulator coefficients) for R23, C2, R32, C3, and IDAC2B for a flash calibration.

The algorithm begins at S905, at which a modulator order and an oversampling ratio (OSR) is chosen.

At S910, a Butterworth filter is designed based on the modulator order and the OSR. A desired infinity norm $\|H\|_\infty$ is chosen at S915. At S920, a filter is plotted in the frequency domain, and the infinity norm $\|H\|_\infty$ is determined. A determination is then made at S925 as to whether the infinity norm $\|H\|_\infty$ is what is desired.

If it is determined at S925 that the infinity norm $\|H\|_\infty$ is not what is desired, then the algorithm proceeds to S930. A determination is made at S930 as to whether the infinity norm $\|H_\infty\|$ is too large.

If it is determined in S930 that the infinity norm $\|H\|_\infty$ is too large, the filter poles are moved away from the z-domain unit circle at S935. On the other hand, if the infinity norm ∥H∥∞ is not large enough, then the filter poles are moved closer to the z-domain unit circle at S940. After the filter poles are moved at S935 or S940, the algorithm returns to S920 to plot the filter in the frequency domain.

If it is determined at S925 that the infinity norm ∥H∥∞ is what is desired, then the algorithm proceeds to S945. At S945, the ADC is simulated with no input or a small input. Subsequently, at S950, a determination is made as to whether the ADC is stable.

If it is determined at S950 that the ADC is not stable, then the infinity norm ∥H∥∞ is too high. The algorithm then returns to S915 to choose a desired infinity norm ∥H∥∞.

On the other hand, if it is determined at S950 that the ADC is stable, the transfer function is converted to ADC coefficients at S955. In particular, the transfer function is converted to component values for resistors (e.g., R23, R32), capacitors (e.g., C2, C3), and DAC currents (e.g., IDAC2B). These values can be written by a SPI interface.

A flash offset calibration is then simulated at S960. The algorithm then proceeds to S965.

At S965, it is determined whether the calibration succeeded. If the calibration did not succeed, the algorithm returns to choose a desired infinity norm ∥H∥∞ at S915. In one embodiment, the calibration does not succeed because the infinity norm ∥H∥∞ is too low.

On the other hand, if it is determined in S965 that the calibration succeeded, the algorithm ends.

Figure 10:
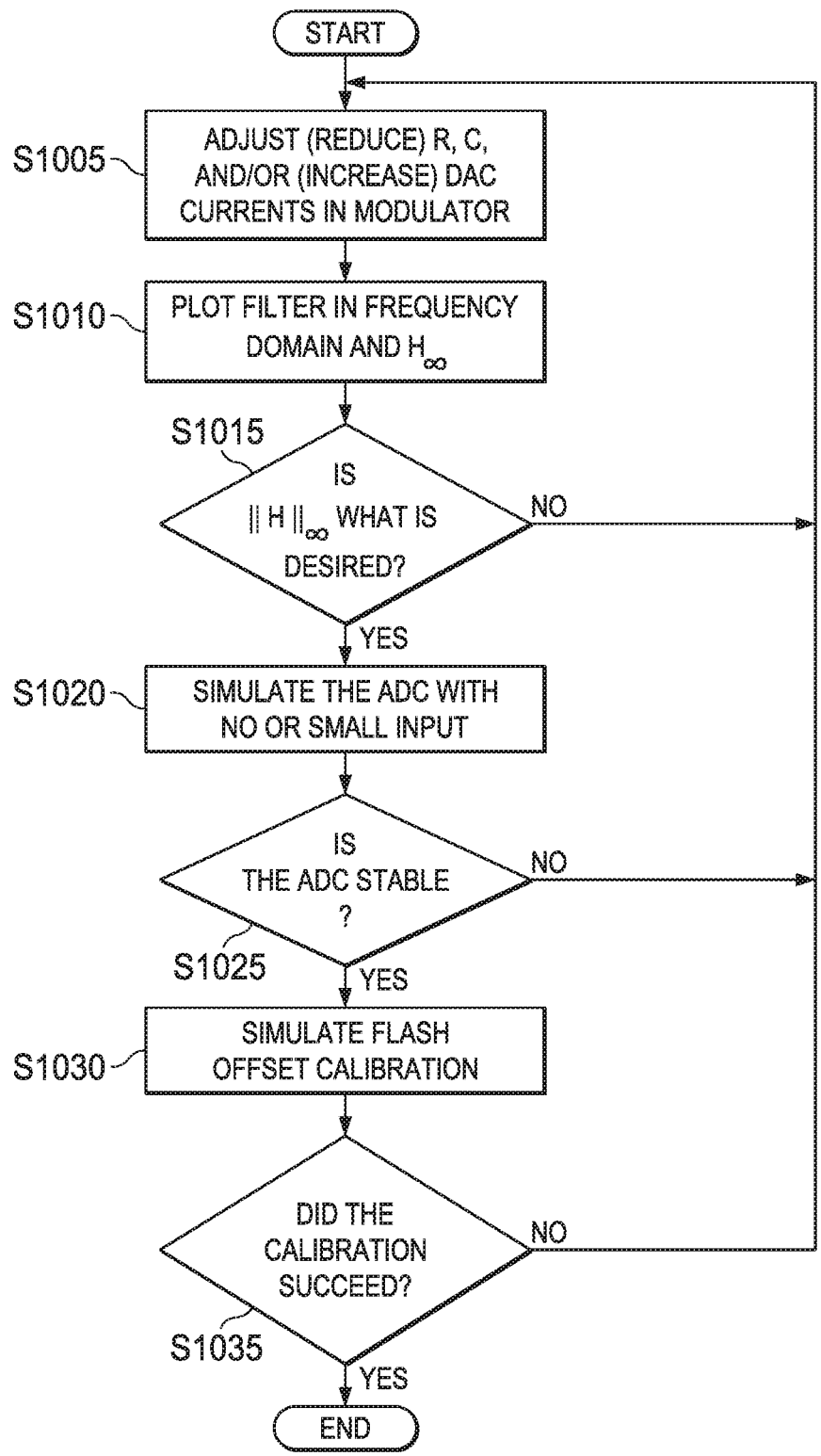
FIG. 10 shows an exemplary algorithm for obtaining a set of component values for a flash ADC calibration.

FIG. 10 describes a simpler procedure, based primarily on trial-and-error, for obtaining a set of component values for a flash ADC calibration.

First, at S1005, the resistor or capacitor values are reduced or the DAC currents are increased in the modulator. The algorithm then advances to S1010.

At S1010, the filter is plotted in the frequency domain, and the infinity norm $H_\infty$ is found.

Next, it is determined at S1015 whether the infinity norm ∥H∥∞ is what is desired.

If it is determined at S1015 that the infinity norm ∥H∥∞ is not what is desired, the algorithm returns to S1005.

On the other hand, if it is determined at S1015 that the infinity norm ∥H∥∞ is what is desired, the algorithm advances to S1020.

At S1020, the ADC is simulated with no input or a small input. The algorithm then advances to S1025.

At S1025, it is determined whether the ADC is stable.

If it is determined the ADC is not stable in S1025, then the algorithm returns to S1005. In one embodiment, the ADC is not stable because the infinity norm ∥H∥∞ is too high.

On the other hand, if it is determined in S1025 that the ADC is stable, then the algorithm proceeds to S1030.

At S1030, the flash ADC offset calibration is simulated. The algorithm then proceeds to S1035.

It is then determined in S1035 whether the calibration succeeded.

If it is determined in S1035 that the calibration did not succeed, the algorithm returns to S1005. In one embodiment, the calibration does not succeed because the infinity norm $H_\infty$ is too low.

Alternatively, if it is determined in S1035 that the calibration did succeed, the algorithm concludes.

FIG. 11 describes the flash ADC calibration with the new (i.e., modified) component values. On start-up, the ADC will be programmed with the default component values. Prior to performing flash calibration, the new component values are set at S1110. In particular, the resistor, capacitor, and DAC current values are changed to the predetermined modified values.

Calibration of the flash ADC is performed at S1120 using the changed values of the resistors, capacitors, and DAC currents in the loop filter. First, the analog input is disconnected during this calibration with the modified loop filter. Further, an RMS meter receives and measures the output power of the ADC. The RMS meter produces an output that indicates the direction to adjust the flash offset correction registers of the ADC. The output of the RMS meter is received by calibration logic or a tester, for example. The algorithm then advances to S1130.

At S1130, the loop filter and its components (e.g., resistors, capacitors, and DAC current) are changed back to the original mode. That is, the default component values are written back into the ADC using SPI. The component values are again changed because the modified loop filter has issues with stability when a sufficiently large input is applied to the ADC, such as during use. The algorithm then concludes.

Figure 16:
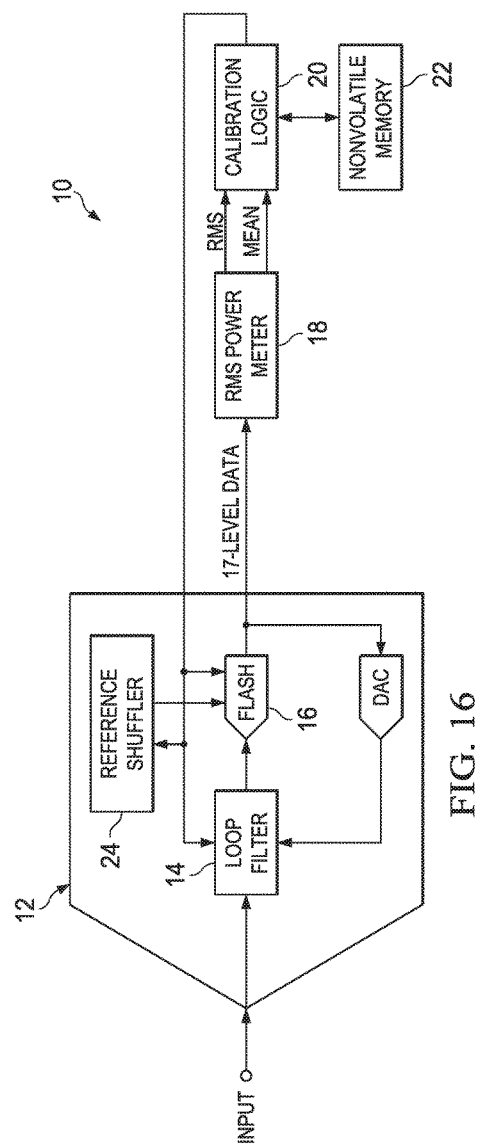
FIG. 16 shows an example of a system in accordance with an implementation of the present disclosure.

FIG. 16 shows an example of a system 10 in accordance with an implementation of the present disclosure. The system 10 includes an ADC 12 that includes a loop filter 14, a reference shuffler 24, a flash ADC 16, and a DAC. The system also includes an RMS power meter 18, calibration logic 20, and nonvolatile memory 22. The loop filter 14 receives an input signal and produces an output to the flash ADC 16. The flash ADC 16 performs an analog-to-digital conversion on the output of the loop filter 14 to produce 17-level digital data. The reference shuffler 24 can modify references of comparators within flash ADC 16. Thus, the output of flash ADC 16 is partially based on values reference values received from reference shuffler 24.

The RMS power meter 18 receives the 17-level digital data from the flash ADC 16 and measures a power (e.g., an RMS power or a mean power) of the digital data. The RMS power meter outputs values representing the RMS power and the mean power to the calibration logic 20.

The calibration logic 20 can perform the operations of the algorithms set forth above. In implementations in which nonvolatile memory 22 is present, calibration logic 20 can store and retrieve values from the nonvolatile memory 22. Nonvolatile memory 22 can store, for example, calibration codes.

Calibration logic 20 outputs values to reference shuffler 24, loop filter 14, and/or flash ADC 16, according to algorithms set forth above.

Implementations of a system according to the present disclosure are not limited to the example shown in FIG. 16. In particular, some of the illustrated components (e.g., nonvolatile memory 22) can be optionally excluded. In addition, other components can be included.

Other Implementation Notes, Variations, and Applications

In some embodiments, S712 can be modified to pick a comparator that has not yet been selected. This modification can reduce the time spent searching for calibration coefficients while trying to exercise all of the comparators.

While the embodiments described herein are described in relation to a delta sigma modulator having a feedback DAC, the methods can also be applied to other architectures. In some cases, the algorithms can also be applied to stand-alone high speed DACs.

In one example embodiment, the electrical circuits of the FIGURES can be implemented on a board of an electronic device. The board can be a general circuit board that can hold various components of the internal electronic system of the electronic device and, further, provide connectors for other peripherals. More specifically, the board can provide the electrical connections by which the other components of the system can communicate electrically. Processors (inclusive of digital signal processors, microprocessors, and supporting chipsets) and computer-readable non-transitory memory elements can be coupled to the board based on configuration targets, processing demands, computer designs, etc. Other components such as external storage, additional sensors, controllers for audio/video display, and peripheral devices can be attached to the board as plug-in cards, via cables, or integrated into the board itself. In various embodiments, the functionalities described herein can be implemented in emulation form as software or firmware running within one or more configurable (e.g., programmable) elements arranged in a structure that supports these emulation functions. The software or firmware providing the emulation can be provided on non-transitory computer-readable storage medium comprising instructions to allow a processor to carry out those functionalities.

In another example embodiment, the electrical circuits of the FIGURES can be implemented as stand-alone modules (e.g., a device with components and circuitry configured to perform a specific application or function) or implemented as plug-in modules into application specific hardware of electronic devices. Particular embodiments of the present disclosure may be included in a system on chip (SOC) package, either in part or in whole. An SOC represents an IC that integrates components of a computer or other electronic system into a single chip. It can contain digital, analog, mixed-signal, and often radio frequency functions: all of which may be provided on a single chip substrate. Other embodiments can include a multi-chip-module (MCM), with a plurality of separate ICs located within a single electronic package and configured to interact closely with each other through the electronic package. In various other embodiments, the digital filters can be implemented in one or more silicon cores in Application Specific Integrated Circuits (ASICs), Field Programmable Gate Arrays (FPGAs), and other semiconductor chips.

The specifications, dimensions, and relationships outlined herein (e.g., the number of processors and logic operations) have only been offered for purposes of example and teaching only. Such information can be varied considerably without departing from the spirit of the present disclosure or the scope of the appended claims. The specifications apply only to one non-limiting example and, accordingly, they should be construed as such. In the foregoing description, example embodiments have been described with reference to particular processor and/or component arrangements. Various modifications and changes can be made to such embodiments without departing from the scope of the appended claims. The description and drawings are, accordingly, to be regarded in an illustrative rather than in a restrictive sense.

The present is particularly suitable for high speed, continuous-time, high precision applications where MASH ADCs are used. Applications that can greatly benefit from the architecture include: instrumentation, testing, spectral analyzers, military purposes, radar, wired or wireless communications, mobile telephones (especially because standards continue to push for higher speed communications), and base stations.

With the numerous examples provided herein, interaction can be described in terms of two, three, four, or more electrical components. However, this has been done for purposes of clarity and example only. The system can be consolidated in any manner. Along similar design alternatives, any of the illustrated components, modules, and elements of the FIGURES can be combined in various possible configurations, all of which are clearly within the scope of this Specification. In certain cases, it can be easier to describe one or more of the functionalities of a given set of flows by only referencing a limited number of electrical elements. The electrical circuits of the FIGURES and its teachings are readily scalable and can accommodate a large number of components, as well as more complicated/sophisticated arrangements and configurations. Accordingly, the examples provided should not limit the scope or inhibit the teachings of the electrical circuits as potentially applied to a myriad of other architectures.

In this Specification, references to various features (e.g., elements, structures, modules, components, steps, operations, and characteristics) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

Some of the operations of this disclosure can be deleted or removed where appropriate, or these operations can be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications can be ascertained to one skilled in the art, and the present disclosure encompasses all such changes, substitutions, variations, alterations, and modifications as falling within the scope of the summary of features. Optional features of the apparatus described above can also be implemented with respect to the method or process described herein and specifics in the examples can be used anywhere in one or more embodiments.

The invention claimed is:

1. A system for calibrating an analog-to-digital converter, the system comprising:
    the analog-to-digital converter, which receives an analog input and includes a comparator that compares the analog input to a reference voltage, and a reference shuffler that shuffles a reference for the reference voltage of the comparator, the comparator to convert the analog input to digital data based on the reference;
    an RMS meter that measures a power of the digital data;
    calibration logic that calibrates the analog-to-digital converter based on the power of the digital data; and
    a nonvolatile memory that stores a calibration code for the analog-to-digital converter, wherein the calibration logic changes the calibration code by a first predetermined value to produce a changed calibration code, the analog-to-digital converter produces an output based on the changed calibration code, and the calibration logic stores the changed calibration code in the nonvolatile memory, if the output is less than a second predetermined value.

2. The system of claim 1, wherein the calibration logic retrieves the calibration code from the nonvolatile memory.

3. The system of claim 1, wherein the calibration logic determines whether the power of the digital data is less than a predetermined value.

4. The system of claim 1, wherein the calibration logic determines a calibration code that minimizes a power output for the analog-to-digital converter.

5. The system of claim 1, wherein the calibration logic changes the calibration code by decreasing the calibration code by the first predetermined value to produce the changed calibration code.

6. The system of claim 1, wherein the calibration logic changes the calibration code by increasing the calibration code by the first predetermined value to produce the changed calibration code.

7. A system for a calibration of an analog-to-digital converter, the system comprising:
a plurality of comparators that receive an input analog signal, compare the input analog signal to a plurality of references, and output a digital signal;
a reference shuffler that shuffles the plurality of references;
an RMS meter that receives the digital signal and outputs a measured signal; and
calibration logic configured to perform an incremental shuffling for the plurality of comparators and to determine a calibration coefficient that minimizes an average flash power of one of the plurality of comparators, based on the measured signal, wherein the calibration logic computes a total flash power for each of the references and divides the total flash power by a number of shuffler references to determine the average flash power.

8. The system of claim 7, wherein the calibration coefficient is determined for a plurality of calibration coefficient values.

9. The system of claim 7, wherein the calibration logic calibrates each of the plurality of comparators.

10. The system of claim 7, wherein the calibration is performed a predetermined number of times.

11. The system of claim 7, wherein the calibration logic is configured to randomly change the calibration coefficient to produce a seed for a next calibration.

12. A non-transitory, computer readable storage medium encoded with computer program instructions, executable by a processor, for performing operations for calibrating an analog-to-digital converter, the operations comprising:
plotting a transfer function for the analog-to-digital converter in a frequency domain;
determining whether an infinity norm of the transfer function is sufficient;
determining whether the analog-to-digital converter is stable;
converting the transfer function of the analog-to-digital converter to a value of a component of the analog-to-digital converter, wherein the component is a resistor, capacitor, or current source;
simulating a calibration of the analog-to-digital converter; and
writing the value of the component to the analog-to-digital converter, if the analog-to-digital converter is determined to be stable.

13. The medium of claim 12, the operations further comprising:
moving transfer function poles away from a z-domain unit circle, if the infinity norm of a filter of the analog-to-digital converter exceeds a threshold.

14. The medium of claim 13, the operations further comprising:
moving transfer function poles closer to the z-domain unit circle, if the infinity norm of the filter does not exceed the threshold.

15. A non-transitory, computer readable storage medium encoded with computer program instructions, executable by a processor, for performing operations for calibrating an analog-to-digital converter, the operations comprising:
calibrating the analog-to-digital converter based on a power of digital data measured by an RMS meter;
changing a calibration code, stored by a nonvolatile memory, by a first predetermined value to produce a changed calibration code, wherein the analog-to-digital converter compares an analog input to a reference voltage, converts the analog input to the digital data based on a reference for the reference voltage, and produces an output based on the changed calibration code; and
storing the changed calibration code in the nonvolatile memory, if the output is less than a second predetermined value.

16. The medium of claim 15, the operations further comprising:
determining a calibration code that minimizes a power output for the analog-to-digital converter.

17. A non-transitory, computer readable storage medium encoded with computer program instructions, executable by a processor, for a calibration of an analog-to- digital converter, the operations comprising:
performing an incremental shuffling for a plurality of comparators, wherein the plurality of comparators compare an analog signal to a plurality of references and output a digital signal, and the plurality of references are shuffled by a reference shuffler;
determining a calibration coefficient that minimizes an average flash power of one of the plurality of comparators, based on a measured signal output by an RMS meter that receives the digital signal;
computing a total flash power for each of the references; and
dividing the total flash power by a number of shuffler references to determine the average flash power.

18. The medium of claim 17, the operations further comprising:
randomly changing the calibration coefficient to produce a seed for a next calibration.

19. An apparatus for calibrating an analog-to-digital converter, comprising:
a memory that stores instructions; and
a processor configured to execute the instructions to plot a transfer function for the analog-to-digital converter in a frequency domain, to determine whether an infinity norm of the transfer function is sufficient, to determine whether the analog-to-digital converter is stable, to convert the transfer function of the analog-to-digital converter to a value of a component of the analog-to-digital converter, wherein the component is a resistor, capacitor, or current source, to simulate a calibration of the analog-to-digital converter, and to write the value of the component to the analog-to-digital converter, if the analog-to-digital converter is determined to be stable.

20. The apparatus of claim 19, wherein the processor moves transfer function poles away from a z-domain unit circle, if the infinity norm of a filter of the analog-to-digital converter exceeds a threshold.

* * * * *